United States Patent [19]

Sugino et al.

[11] Patent Number: 5,221,423

[45] Date of Patent: Jun. 22, 1993

[54] PROCESS FOR CLEANING SURFACE OF SEMICONDUCTOR SUBSTRATE

[75] Inventors: Rinshi Sugino, Atsugi; Takashi Ito, Kawasaki, both of Japan

[73] Assignee: Fujitsu Limited, Kawasaki, Japan

[21] Appl. No.: 747,419

[22] Filed: Aug. 19, 1991

Related U.S. Application Data

[63] Continuation of Ser. No. 467,328, Jan. 18, 1990, abandoned, which is a continuation of Ser. No. 51,395, May 19, 1987, abandoned.

[30] Foreign Application Priority Data

May 20, 1986 [JP] Japan ............................... 61-116423

[51] Int. Cl.⁵ ............................................... H01L 21/00
[52] U.S. Cl. .................................... 156/643; 156/646; 156/651; 156/656; 156/657; 156/662; 252/79.1; 252/79.3; 134/1; 134/2; 134/3
[58] Field of Search ............... 156/628, 643, 657, 646, 156/662, 656, 651; 252/79.2, 79.3, 79.1; 134/1-3

[56] References Cited

U.S. PATENT DOCUMENTS

| | | | |
|---|---|---|---|
| 3,926,699 | 12/1975 | Dixon | 252/79.3 X |
| 4,226,666 | 10/1980 | Winters et al. | 252/79.1 X |
| 4,264,374 | 4/1981 | Beyer et al. | 134/3 |
| 4,350,563 | 9/1982 | Takada et al. | 156/665 X |
| 4,478,677 | 10/1984 | Chen et al. | 156/643 |
| 4,522,674 | 6/1985 | Ninomiya et al. | 156/643 X |
| 4,615,756 | 10/1986 | Tsujii et al. | 156/643 X |
| 4,622,095 | 11/1986 | Grobman et al. | 156/646 X |
| 4,631,113 | 12/1986 | Donald | 156/665 X |
| 4,689,112 | 8/1987 | Bersin | 156/659.1 X |
| 4,690,730 | 9/1987 | Tang et al. | 156/643 |
| 4,693,779 | 9/1987 | Okuhira et al. | 156/643 X |
| 4,871,416 | 10/1989 | Fukuda | 156/646 X |

FOREIGN PATENT DOCUMENTS 61-53732(A) 3/1986 Japan.

OTHER PUBLICATIONS

*RCA Review*, Jun. 1970, Werner Kern & David A. Puotinen, entitled "Cleaning Solutions Based on Hydrogen Peroxide for use in Silicon Semiconductor Technology," pp. 187–206.

A. C. Beyer et al., "Liquid HF Etching Without Contamination", IBM Technical Disclosure Bulletin, vol. 20, No. 5, Oct., 1977, pp. 1741–1742, New York, U.S.

*Primary Examiner*—Thi Dang
*Attorney, Agent, or Firm*—Staas & Halsey

[57] ABSTRACT

The surface of a semiconductor substrate is cleaned effectively by etching the surface by placing the substrate in a halogen containing atmosphere, irradiating the atmosphere and the semiconductor surface with ultraviolet rays, and wet solution cleaning of the formed reactant from the substrate surface.

5 Claims, 2 Drawing Sheets

PROCESS FOR CLEANING SURFACE OF SEMICONDUCTOR SUBSTRATE

This application is a continuation of application Ser. No. 07/467,328, filed Jan. 18, 1990, now abandoned, which is a continuation of application Ser. No. 07/051,395, filed May 19, 1987, now abandoned.

BACKGROUND OF THE INVENTION

1. Field of the Invention

The present invention relates to a process for treating a surface of a semiconductor substrate, and more specifically, to a process for cleaning a surface of a semiconductor substrate prior to forming an epitaxial layer a CVD layer a thermal oxide layer, a thermal nitride layer, or other film layer on the substrate.

2. Description of the Related Art

In a known process for cleaning a surface of a semiconductor substrate, the surface is wet cleaned with an aqueous solution containing hydrogen peroxide and ammonia (for example, RCA Review, June 1970, pp 187–206). The cleaning efficiency of this process is, however, unsatisfactory.

A more effective process for cleaning a surface of a semiconductor substrate is known, in which the surface of the semiconductor substrate is preoxidized (also referred to as sacrifical oxidation) before wet cleaning as mentioned-above. This process comprises, for example, sequentially wet cleaning a substrate, oxidizing a surface of the substrate, removing the oxidized layer from the substrate, wet cleaning the surface of the substrate again, and forming a required layer on the surface of the substrate. However, this process is disadvantageous in that it involves many complicated steps, including the oxidation step. Moreover, the heat treatment necessary for oxidation causes contaminants to diffuse into the semiconductor substrate, so that removal of the contaminants is made more difficult. Particularly, when an extremely thin layer such as a gate insulating layer of a MOS-VLSI is formed on the cleaned surface of the substrate, such remaining contaminants cause a deterioration of the extremely thin layer.

SUMMARY OF THE INVENTION

The main object of the present invention is to provide a process for treating a surface of a semiconductor substrate, which process permits an unimpaired layer to be formed on the treated surface of the substrate.

The above and other objects, features, and advantages of the present invention are realized by providing a process for treating a surface of a semiconductor substrate, this process comprising the steps of: etching a surface of the semiconductor substrate by placing the semiconductor substrate in a halogen-containing atmosphere and irradiating at least one of the atmosphere above the semiconductor substrate and the surface of the semiconductor substrate with ultraviolet rays; and then wet cleaning the surface of the semiconductor substrate with a cleaning solution.

When ultraviolet rays are irradiated in a halogen-containing atmosphere, the halogen is excited and is brought to a radical or ion state, and etches the surface of a semiconductor substrate. In this case, since heat is not applied, contaminants existing on and adjacent to the surface are not caused to diffuse into the semiconductor substrate and, therefore, are easily and completely removed by etching. At the same time, contaminants such as alkali or other metals in the semiconductor substrate are effectively extracted due to a formation of chemical bonds with the halogen radicals.

Although reaction products formed from halogen and substrate-constituting materials, for example, silicon, remain on the surface of the semiconductor substrate after halogen etching, these reaction products are easily removed by subsequently wet cleaning the substrate with an aqueous solution containing hydrogen peroxide and ammonia.

DESCRIPTION OF THE PREFERRED EMBODIMENTS

The present invention is further described with reference to the drawings.

Figure 1:
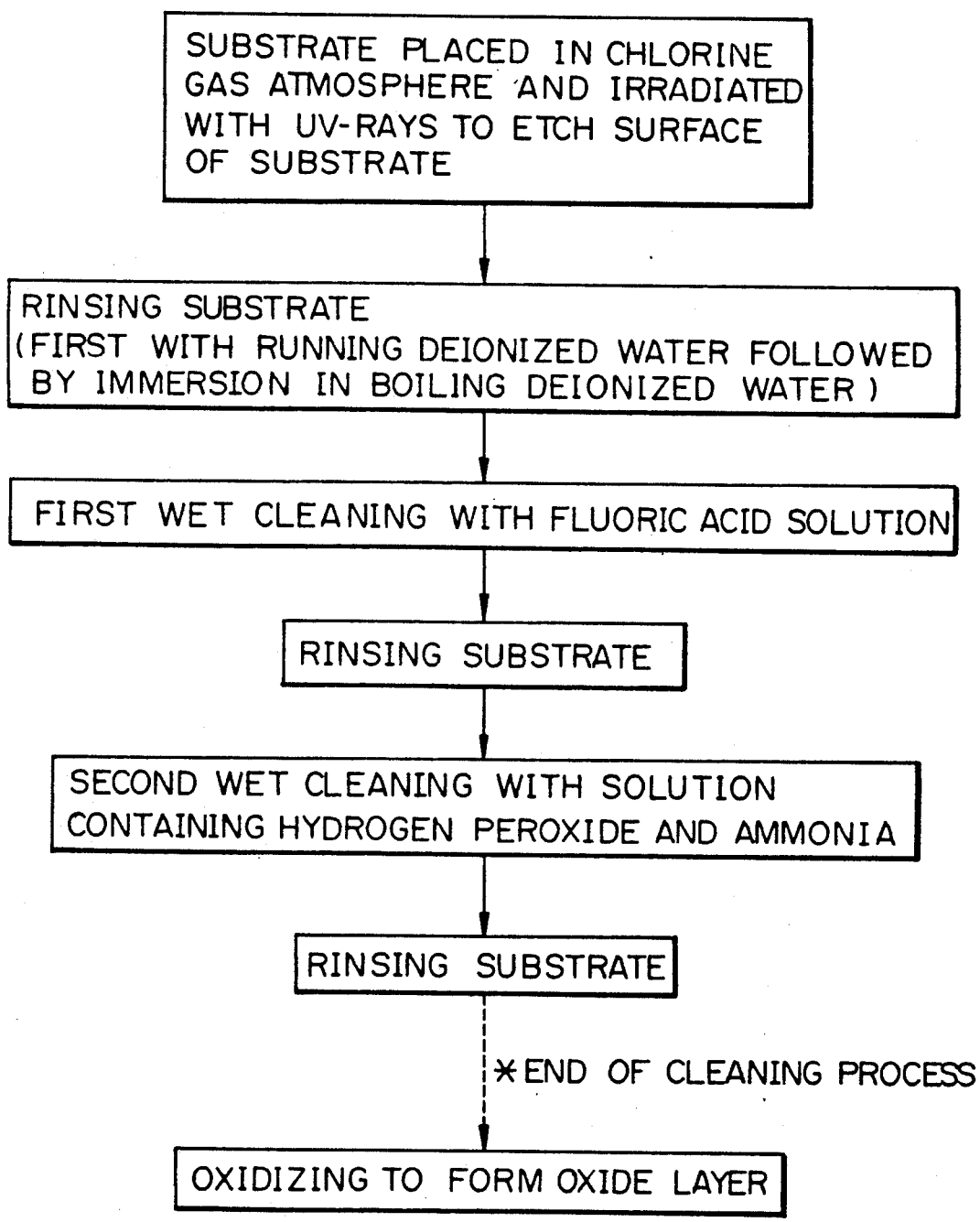
FIG. 1 is a flow chart of a preferred process according to the present invention.

FIG. 1 is a flow chart of a preferred process for treating a surface of a semiconductor substrate, as described below.

Figure 2:
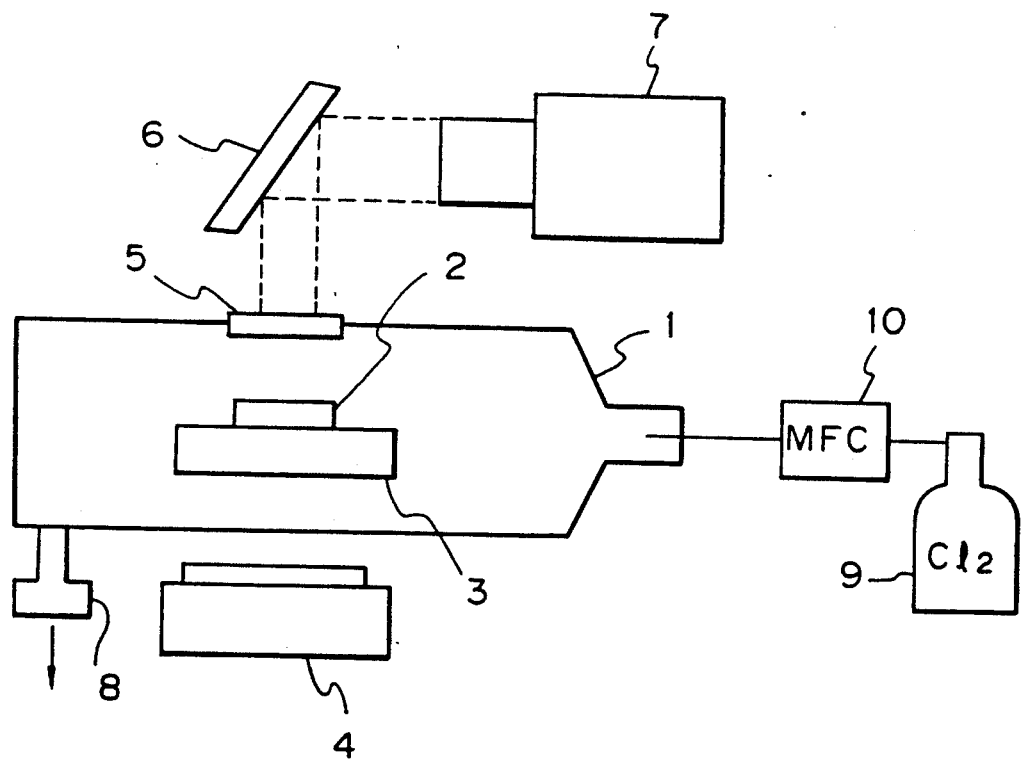
FIG. 2 is a schematical view of an etching system which can be used in a process according to the present invention.

FIG. 2 is a diagram of an etching system, in which reference numeral 1 denotes an etching chamber, 2 a semiconductor substrate, 3 a susceptor for supporting the substrate 1, 4 an IR heater, 5 a quartz window for transmitting UV rays, 6 a mirror, 7 a UV ray source, 8 a connector to a vacuum pump, 9 a container of chlorine, and 10 a valve.

A p-type silicon substrate 2, for example, was placed on a susceptor 3 in a chamber 1 and heated to about 10020 C. High purity chlorine gas, as an etching gas, was introduced from the chlorine container 9 into the chamber 1 and the chamber 1 evacuated to about 20 Torr.

From the UV source 7, UV rays having a wavelength of 150 to 350 nm were irradiated toward the substrate 2 through the window 5 at a strength of 10 to 200 $mW/cm^2$ for 1 to 5 minutes.

This irradiation caused the chlorine gas to become excited and be brought to a radical state, and thus etch the surface of the silicon substrate 2 to a depth of 10 to 100 nm.

The substrate 2 was then rinsed with running deionized water followed by immersion in boiling deionized water. Subsequently, the substrate was subjected to conventional wet solution cleaning, wherein first the substrate was wet cleaned with a 3% aqueous fluoric acid solution, rinsed with running deionized water and boiling deionized water, and then wet cleaned with an aqueous solution containing 22% hydrogen peroxide and 16% ammonia.

Finally, the substrate was rinsed with running deionized water and then immersed in boiling deionized water.

This completed the surface treatment or cleaning of a silicon substrate according to the present invention.

After a surface of a silicon substrate was cleaned as described above, the cleaned surface of the silicon substrate was oxidized at 1000° C. for 10 minutes to form a silicon dioxide layer having a thickness of 20 nm. The breakdown voltage of the silicon dioxide layer was 10.5 MV/cm.

For comparison, the same silicon substrate as above was subjected to the same wet solution cleaning as above, without a prior irradiation of UV ray in a halogen-containing atmosphere, and oxidized to form a silicon dioxide layer having a thickness of 20 nm. The breakdown voltage of this silicon dioxide layer was 9.5 MV/cm.

Atomic absorption spectroscopy was conducted to examine the surface contamination of the resultant two silicon substrates. The results are shown in the following Table.

TABLE

| | (unit: ppb) | | | |
|---|---|---|---|---|
| | Al | Fe | Na | Cr |
| Solution wash only | 300 | 31 | 6 | 0.6 |
| UV-Cl treatment + wet Solution cleaning | 150 | 11 | 3 | 0.06 |

From the above, it is apparent that the surface of the silicon substrate was more effectively cleaned by the process according to the present invention than by a conventional process.

Similar effects can be obtained by replacing the chlorine gas with other halogen such as $F_2$ or $Br_2$, a hydrogen halide such as HCl, HF or HBr, a boron halide such as $BCl_3$, $BF_3$ or $BBr_3$, an interhalogen compound such as ClF and BrF, a nitrogen halide such as $NF_3$ or $N_2F_2$, a rare gas halide such as $XeF_2$, $KrF_2$ or $XeCl_2$ or the like. The semiconductor substrate may be a compound semiconductor substrate. Other wet cleaning solutions, for example, a solution containing hydrogen chloride and hydrogen peroxide ($HCl.H_2O_2.H_2O$) or nitric acid ($HNO_3$) solution may be used.

We claim:

1. A process for treating a surface of a semiconductor substrate containing metal contaminants, said process comprising the steps of:

placing the semiconductor substrate in a plasma-free atmosphere containing high purity chlorine gas and irradiating at least one of the atmosphere above the semiconductor substrate and the surface of the semiconductor substrate with ultraviolet rays to excite the chlorine gas in the atmosphere without forming a plasma, thereby forming chlorine radicals which etch the surface of the semiconductor substrate, bond with the contaminant metals from within the semiconductor substrate and form a reaction product with substrate constituting material on the surface of the substrate;

removing the substrate from the plasma free atmosphere; and wet cleaning the surface of the semiconductor substrate with a cleaning solution to remove the reaction product, as well as the metal contaminants bonded to the chlorine radicals.

2. A process according to claim 1, wherein said wet cleaning step comprises wet cleaning the surface of the semiconductor substrate first with a fluoric acid solution and then with a solution containing hydrogen peroxide and ammonia.

3. A process according to claim 1, wherein said semiconductor substrate is made of silicon.

4. A process for treating a surface of a silicon semiconductor substrate containing metal contaminants, said process comprising the steps of:

etching a surface of the silicon semiconductor substrate by placing the substrate in a substantially plasma-free atmosphere containing high purity chlorine gas and irradiating at least the atmosphere above the substrate and the surface of the semiconductor substrate with ultraviolet rays to excite the chlorine gas, thereby forming chlorine radicals which etch the surface of the semiconductor substrate, bond with the contaminant metals from within the semiconductor substrate and form a reaction product with substrate constituting material on the surface of the substrate;

removing the substrate from the plasma-free atmosphere;

rinsing the substrate;

wet cleaning the surface of the substrate with an aqueous fluoric acid solution;

rinsing the substrate;

wet cleaning the surface of the substrate with an aqueous solution containing hydrogen peroxide and ammonia; and rinsing the substrate, said rinsing and wet cleaning steps removing the reaction product, as well as the metal contaminants bonded to the chlorine radicals.

5. A process according to claim 4, wherein said rinsing steps comprise first cleaning the surface of the substrate with running deionized water and then immersing the substrate in boiling deionized water.

* * * * *